(12) United States Patent
Nojima

(10) Patent No.: US 10,566,964 B2
(45) Date of Patent: Feb. 18, 2020

(54) APPARATUS AND METHODS FOR OVERVOLTAGE PROTECTION OF ELECTRONIC DEVICES

(71) Applicant: Eaton Intelligent Power Limited, Dublin (IE)

(72) Inventor: Geraldo Nojima, Matthews, NC (US)

(73) Assignee: Eaton Intelligent Power Limited (IE)

( * ) Notice: Subject to any disclaimer, the term of this patent is extended or adjusted under 35 U.S.C. 154(b) by 257 days.

(21) Appl. No.: 15/594,899

(22) Filed: May 15, 2017

(65) Prior Publication Data

US 2018/0331534 A1    Nov. 15, 2018

(51) Int. Cl.
*H03K 17/08*  (2006.01)
*H02M 1/08*  (2006.01)
*H03K 19/003*  (2006.01)

(52) U.S. Cl.
CPC .............. *H03K 17/08* (2013.01); *H02M 1/08* (2013.01); *H03K 19/003* (2013.01)

(58) Field of Classification Search
CPC ............................. H03K 17/08; H02H 9/041
See application file for complete search history.

(56) References Cited

U.S. PATENT DOCUMENTS

| | | | |
|---|---|---|---|
| 5,621,599 A | 4/1997 | Larsen et al. | |
| 6,459,559 B1 | 10/2002 | Christofersen | |
| 8,624,431 B2 | 1/2014 | Kanakasabai et al. | |
| 2002/0159212 A1* | 10/2002 | Oughton, Jr. | H02H 9/041 |
| | | | 361/111 |
| 2006/0001497 A1* | 1/2006 | Minteer | H01H 47/226 |
| | | | 331/139 |
| 2012/0218672 A1* | 8/2012 | Nunes | H02M 1/32 |
| | | | 361/91.1 |
| 2013/0026831 A1 | 1/2013 | Sihler et al. | |
| 2013/0286546 A1 | 10/2013 | Hazel et al. | |

(Continued)

FOREIGN PATENT DOCUMENTS

| | | |
|---|---|---|
| DE | 19623541 | 12/1997 |
| EP | 2523296 | 11/2012 |

OTHER PUBLICATIONS

European Search Report; Corresponding Appln No. EP18170253; dated Oct. 15, 2018; pages.

*Primary Examiner* — Scott Bauer

(74) *Attorney, Agent, or Firm* — Stanek Lemon Crouse & Meeks, P.A.

(57) ABSTRACT

An apparatus includes a string of series-connected voltage clamp devices (e.g., metal-oxide varistors (MOVs)) coupled to at least one electronic device (e.g., a transistor or other semiconductor device). The apparatus further includes a bypass circuit configured to selectively bypass a subset of the string of series-connected voltage clamp devices to control a level at which a voltage applied to the at least one electronic device is clamped. A control circuit may be configured to cause the bypass circuit to bypass the subset of the string of series-connected voltage clamp devices responsive to a voltage applied to the at least one electronic device. For example, the control circuit may be configured to cause the bypass circuit to bypass the subset of the string of series-connected voltage clamp devices responsive to a magnitude of the voltage applied to the at least one electronic device exceeding a threshold.

11 Claims, 4 Drawing Sheets

(56) References Cited

U.S. PATENT DOCUMENTS

2016/0087431 A1* 3/2016 Krumpholz ............ H02H 9/005
  361/56
2016/0380428 A1 12/2016 Barker et al.

* cited by examiner

APPARATUS AND METHODS FOR OVERVOLTAGE PROTECTION OF ELECTRONIC DEVICES

BACKGROUND

The inventive subject matter relates to electronic devices, more particularly, to apparatus and methods for protecting electronic devices.

Power semiconductor devices, such as insulated gate bipolar transistors (IGBTs), metal oxide semiconductor field effect transistors (MOSFETs), integrated gate commutated thyristors (IGCTs) and gate turn off thyristors (GTOs) can switch electrical currents in microseconds or even fractions of a microsecond. Such high speed current switching can result in large voltage transients due to the effect of the current rate of change (di/dt) on the power circuit stray inductances. These voltage spikes can damage the semiconductor device and peripheral ancillary components.

Surge transient suppressors are commonly used to protect semiconductor switches against the effects of high voltage spikes. Such transient suppressors include metal oxide varistors (MOVs), which generally are fast transient voltage suppression power devices, but typically exhibit a non-linear clamping voltage versus clamping current behavior. For example, in a relatively large MOV, the operating voltage may be around fifty percent of the clamping voltage at 200A.

A silicon IGBT may have an instantaneous voltage rating of 6.5 kV but, due to the effects of cosmic ray degradation a maximum continuous voltage rating of only 3.8 kV. Accordingly, operating the IGBT at its continuous voltage rating results in a voltage utilization ratio of around 3.8 kV/6.5 kV. To cover for circuit tolerances, one may choose to protect that IGBT with an MOV having a clamping voltage of 6 kV, which is 500V below the maximum instantaneous voltage rating of the IGBT. However, such an MOV may have a continuous operating voltage of only 3 kVdc, which means operating the IGBT at less than its rated continuous DC voltage to provide the desired clamping protection.

Voltage utilization ratio may be tighter in silicon carbide (SiC) power semiconductors. For example, a 10 kV SiC MOSFET or IGBT may be capable of continuous utilization at 8 kVdc, which would entail the use of an MOV having a continuous operating voltage of at least 8 kVdc. However, an MOV with that rating may have a clamping voltage of around 16 kV, which is significantly greater than the SiC semiconductor device's instantaneous voltage rating, and thus may provide inadequate protection. If an MOV with a maximum clamping voltage at around 9.5 kV is used, then the 10 kV SiC semiconductor will be protected but at the price of using a maximum continuous operating voltage of only 4.75 kV, which is well below the 8 kVdc capability of the SiC semiconductor device. Techniques for intermittent application of an MOV to a protected device to reduce steady state voltage across the MOV during normal operation are described in U.S. Pat. No. 5,621,599 to Larsen et al., but there is an ongoing need for improved overvoltage protection techniques.

SUMMARY

Some embodiments of the inventive subject matter provide an apparatus including a string of series-connected voltage clamp devices (e.g., metal-oxide varistors (MOVs)) coupled to at least one electronic device (e.g., a transistor or other semiconductor device). The apparatus further includes a bypass circuit configured to selectively bypass a subset of the string of series-connected voltage clamp devices to control a level at which a voltage applied to the at least one electronic device is clamped. A control circuit may be configured to cause the bypass circuit to bypass the subset of the string of series-connected voltage clamp devices responsive to a voltage applied to the at least one electronic device. For example, the control circuit may be configured to cause the bypass circuit to bypass the subset of the string of series-connected voltage clamp devices responsive to a magnitude of the voltage applied to the at least one electronic device exceeding a threshold.

In some embodiments, the bypass circuit may include at least one switch configured to bypass the subset of the string of series-connected voltage clamp devices responsive to a control signal and the control circuit may be configured to sense the voltage applied to the at least one electronic device and to responsively generate the control signal. In some embodiments, the control circuit may be activated and deactivated responsive to the voltage applied to the at least one electronic device. The bypass circuit may be configured to remain in a non-conducting state when the control circuit is inactive.

Further embodiments provide an apparatus including at least two series-connected MOVs configured to clamp a voltage applied to at least one semiconductor device, a switch configured to selectively bypass a subset of the least two series-connected MOVs, and a control circuit configured to control the switch responsive to the voltage applied to the at least one semiconductor device. The switch may be configured to pass current through a first number of the at least two series-connected MOVs in a first state and to pass current through a second number of the at least two series-connected MOVs in a second state. The first state may provide a clamping voltage greater than a maximum instantaneous voltage rating of the at least one semiconductor device and the second state may provide a clamping voltage less than or equal to the maximum instantaneous voltage rating of the at least one semiconductor device. The first number of the at least two series-connected MOVs may have a maximum continuous operating rating greater than or equal to a maximum continuous operating voltage of the at least one semiconductor device.

In some embodiments, the control circuit may be configured to be activated responsive to the voltage applied to the at least one semiconductor device. In some embodiments, the at least two series-connected MOVs may include a string of series-connected MOVs coupled between first and second terminals of the at least one semiconductor device and the switch may be coupled between a node of the string and one of the first and second terminals.

DETAILED DESCRIPTION

Figure 1:
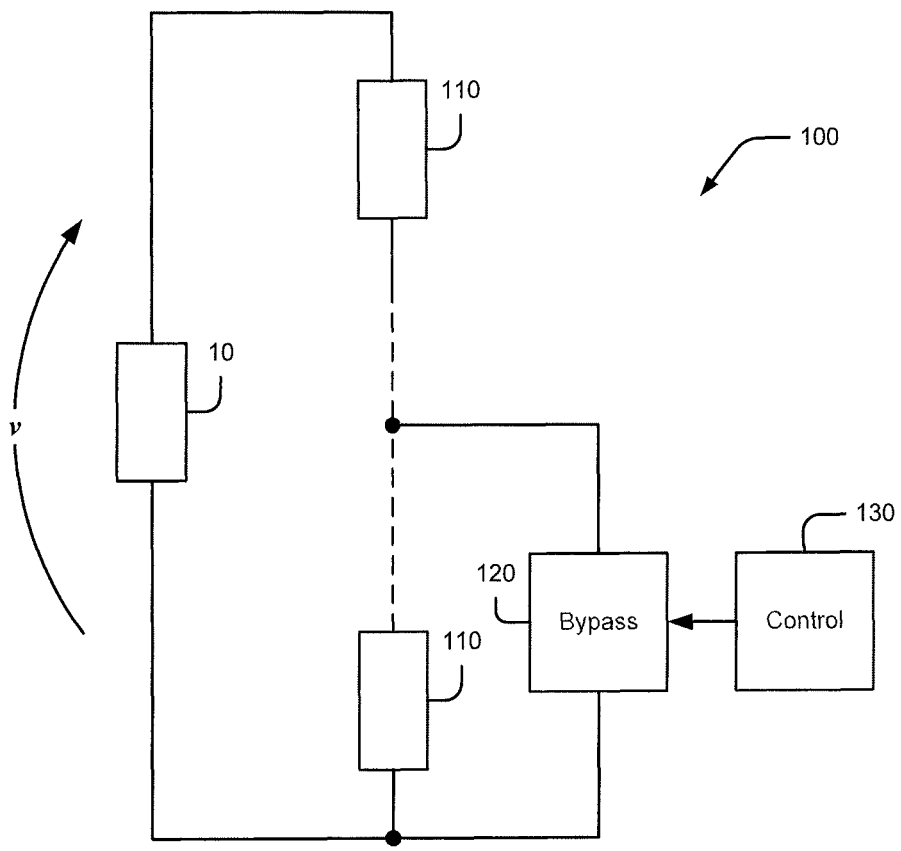
FIG. 1 is a schematic diagram illustrating a semiconductor device protection apparatus according to some embodiments of the inventive subject matter.

Specific exemplary embodiments of the inventive subject matter now will be described with reference to the accompanying drawings. This inventive subject matter may, however, be embodied in many different forms and should not be construed as limited to the embodiments set forth herein; rather, these embodiments are provided so that this disclosure will be thorough and complete, and will fully convey the scope of the inventive subject matter to those skilled in the art. In the drawings, like numbers refer to like items. It will be understood that when an item is referred to as being "connected" or "coupled" to another item, it can be directly connected or coupled to the other item or intervening items may be present. As used herein the term "and/or" includes any and all combinations of one or more of the associated listed items.

The terminology used herein is for the purpose of describing particular embodiments only and is not intended to be limiting of the inventive subject matter. As used herein, the singular forms "a", "an" and "the" are intended to include the plural forms as well, unless expressly stated otherwise. It will be further understood that the terms "includes," "comprises," "including" and/or "comprising," when used in this specification, specify the presence of stated features, integers, steps, operations, items, and/or components, but do not preclude the presence or addition of one or more other features, integers, steps, operations, items, components, and/or groups thereof.

Unless otherwise defined, all terms (including technical and scientific terms) used herein have the same meaning as commonly understood by one of ordinary skill in the art to which this inventive subject matter belongs. It will be further understood that terms, such as those defined in commonly used dictionaries, should be interpreted as having a meaning that is consistent with their meaning in the context of the specification and the relevant art and will not be interpreted in an idealized or overly formal sense unless expressly so defined herein.

Some embodiments of the inventive subject provide an adaptive voltage surge suppressor circuit that can overcome issues with the relationship of maximum clamping voltage and continuous operating voltage outlined above, this providing protection of semiconductor devices while allowing their full power utilization. In some embodiments, a control circuit detects a voltage level exceeding a certain level and transitions from protecting an electronic device (e.g., a transistor or other semiconductor device) with a clamping circuit having a relatively high clamping voltage and maximum continuous voltage rating to protecting the electronic device with a clamping circuit having a lower clamping voltage. In some embodiments, this transition may be achieved by using a switch (e.g., a semiconductor switch or a fast mechanical switch) to bypass a voltage clamping device in a string of clamping devices. The bypass switch may be turned on during a voltage transient that may exceed a maximum instantaneous voltage rating for the protected electronic device. In some embodiments, the string of clamping devices may be a string of series connected metal oxide varistors (MOVs), and the bypass switch may be configured to selectively bypass a portion of the string responsive to a control circuit that detects a voltage applied to the protected electronic device. In some embodiments, the bypass switch can be a normally open device, and the control circuit may be powered by circuitry providing the voltage applied to the protected electronic device, such that the control circuit is only active when a sufficient voltage is applied to the protected electronic device.

FIG. 1 illustrates a protection apparatus 100 configured to protect at least one electronic device 10 (e.g., a semiconductor device, such as a transistor) from excess voltage. The apparatus 100 includes at least two clamping devices 110 connected in series to form a string. In the illustrated embodiments, the string of series-connected clamping devices 110 is coupled in parallel with an electronic device 10 to be protected, but it will be appreciated that in other embodiments, the clamping devices 110 may not be coupled directly in parallel with the protected electronic device 10, e.g., there may be intervening components between the string and the protected device.

A bypass circuit 120 is configured to selectively bypass at least one of the voltage clamping devices 110. In some embodiments, a control circuit 130 may operate the bypass circuit 120 responsive to a voltage v applied to the at least one electronic device 10 to be protected. In some embodiments, the control circuit 130 may be configured to vary a number of the clamping devices 110 connected in parallel with the protected electronic device 10 responsive to the voltage v applied to the protected electronic device 10. For example, when the voltage v applied to the protected electronic device 10 exceeds a certain level, the number of clamping devices 110 coupled in parallel with the protected device 10 may be reduced so that the voltage v applied to the electronic device 10 can be more effectively limited. When the voltage v applied to the protected device 10 is sufficiently low, the control circuit 130 may increase the number of the clamping devices 110 coupled in parallel with the protected device 10, such that a continuous operating voltage rating of the clamping devices 110 coupled in parallel with the protected device 10 is not exceeded.

It will be understood that the protection circuit 100 may be implemented using any of a variety of different circuit components. For example, the clamping devices 110 may include, but are not limited to, MOVs, transient voltage suppressor (TVS) diodes, and the like. The bypass circuit 120 may be implemented using any of a variety of different switching devices, such as transistors, thyristors and/or mechanical switches. The control circuit 130 may be implemented using any of a variety of different analog and/or digital circuit components.

Figure 2:
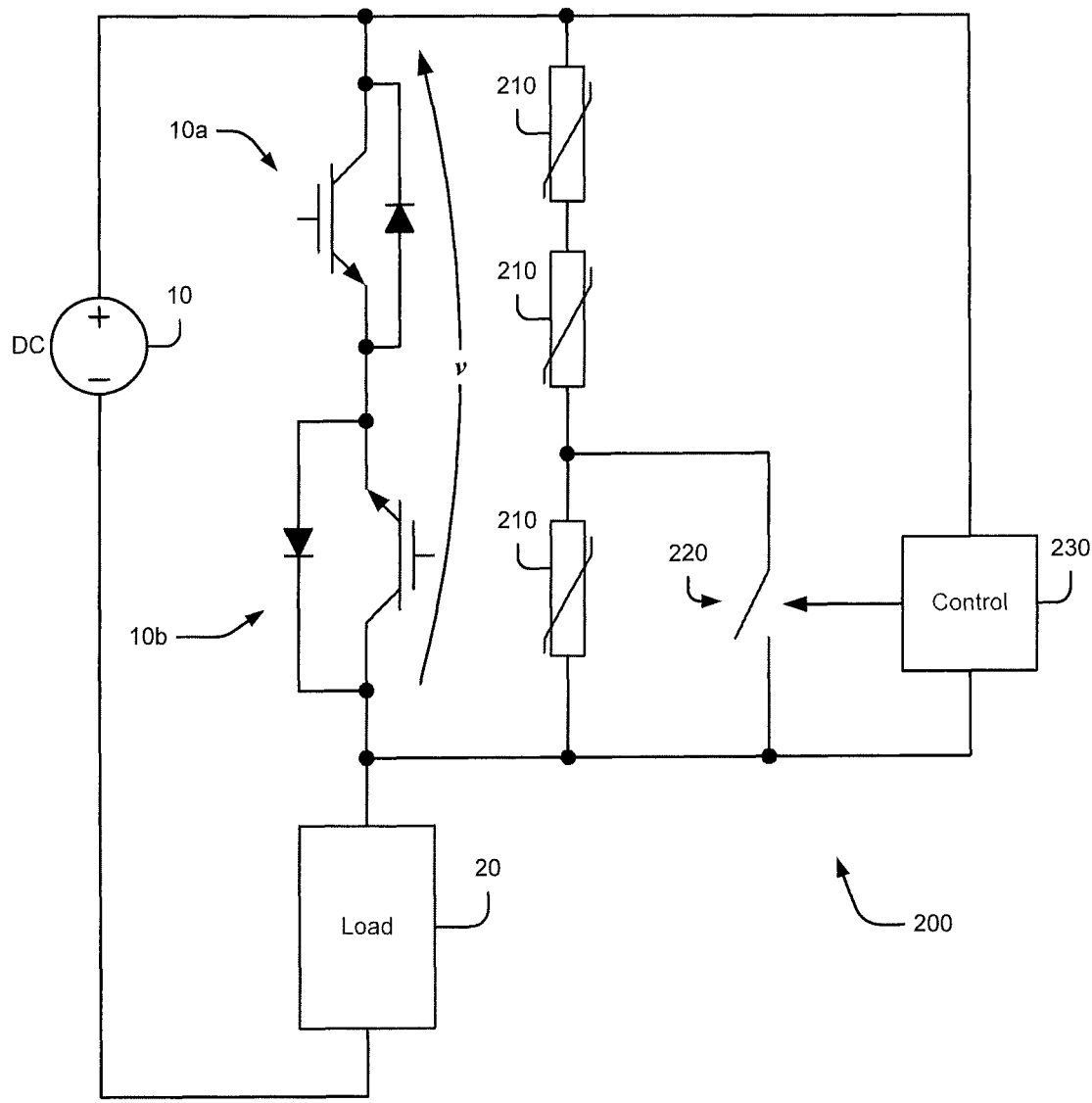
FIG. 2 is a schematic diagram illustrating a semiconductor device protection system according to further embodiments.

FIG. 2 illustrates an example of such an arrangement according to further embodiments. Series-connected IGBTs 10a, 10b that control current provided from a DC power source 10 to a load 20 are protected by an overvoltage protection circuit 200 including a string of three series-connected MOVs 210 connected in parallel with the IGBTs 10a, 10b. A switch 220 is configured to bypass a subset of the MOVs 210 responsive to a control signal, which is generated by a control circuit 230 responsive to a voltage v applied to the protected IGBTs 10a, 10b. The switch 220 may be, for example, a semiconductor switch, such as a transistor or thyristor, and/or a mechanical switch. It will be appreciated that, although the circuit illustrated in FIG. 2 includes a string of three series-connected MOVs 210, some embodiments may use fewer MOVs or a greater number of MOVs. It will be further appreciated that, although the circuit in FIG. 2 shows a switch 220 that bypasses one of the three series-connected MOVs 210, other embodiments may include switches that bypass two or more MOVs.

In some embodiments, when the voltage v applied to the protected IGBTs 10a, 10b exceeds a threshold, the control circuit 230 closes the switch 220 to reduce the number of MOVs 210 coupled in parallel with the IGBTs 10a, 10b, thus reducing a clamping voltage of the overvoltage protection circuit 200. This arrangement can provide enhanced overvoltage protection of the IGBTs 10a, 10b. In particular, in some embodiments, with the switch 220 in a non-conducting (off or open) state, the continuous operating voltage rating of the entire string of MOVs 210 may be equal to greater than a nominal, normal operating level of the voltage v when the IGBTs 10a, 10b are turned off. The clamping voltage of the non-bypassed portion of the string of MOVs 210 may be approximately twice the nominal level of the voltage v with the IGBTs 10a, 10b turned off, and significantly greater than a maximum instantaneous voltage rating of the IGBTs 10a, 10b.

If the voltage v exhibits a significant increase, the control circuit 230 may close the switch 220 to bypass the first subset of MOVs, thus connecting a second subset of the MOVs 210 applied to the protected IGBTs 10a, 10b. In this state, the reduced number of MOVs 210 connected in parallel with the IGBTs 10a, 10b provides a significantly reduced clamping voltage and greater protection of the IGBTs 10a, 10b against voltages above the maximum instantaneous voltage rating of the IGBTs 10a, 10b. For example, the threshold level for turning on the switch 220 may be a certain margin greater than the nominal operating voltage level of the protected IGBTs 10a, 10b. The switch 220 may be maintained in the conducting (on or closed) state until the voltage v falls below a certain level, which may be a level less than the threshold level at which the switch 220 was closed.

Figure 3:
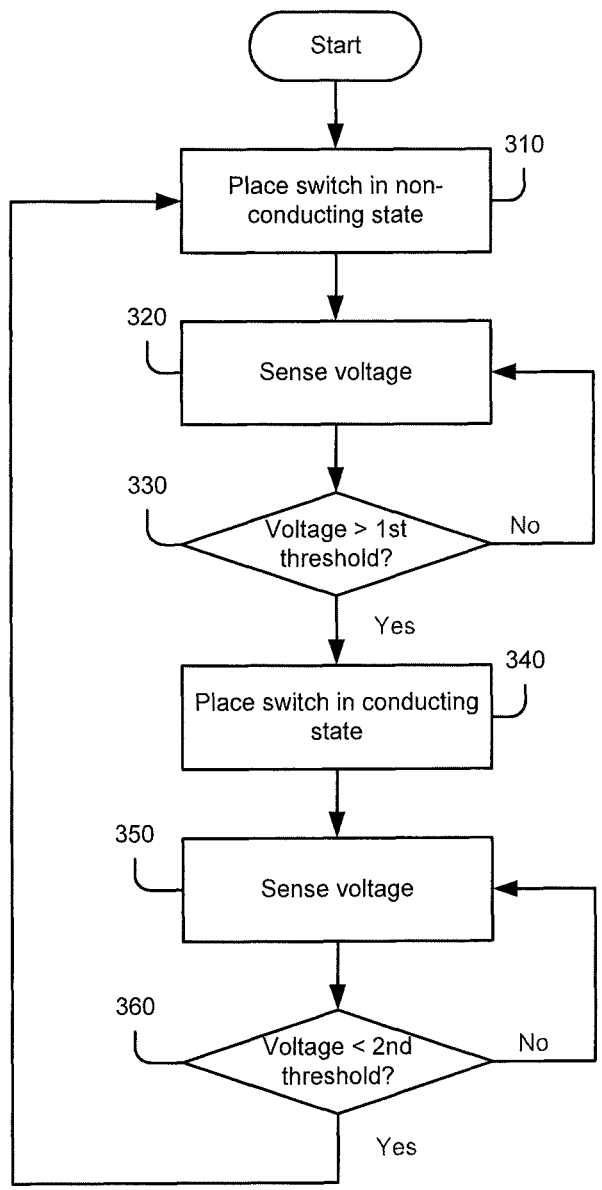
FIG. 3 is a flowchart illustrating operations of a semiconductor device protection apparatus according to still further embodiments.

FIG. 3 is a flowchart illustrating operations of the overvoltage protection circuit 200 of FIG. 2 according to further embodiments. Initially, the switch 220 is in a non-conducting state (block 310). In this state, the control circuit 230 senses the voltage v and, as long as it does not exceed a first threshold level (e.g., the nominal operating voltage level plus a margin), the switch 220 remains in the non-conducting state (blocks 320, 330). If the sensed voltage v exceeds the first threshold level, however, the control circuit 230 places the switch 220 in a conducting state, thus bypassing one or more of the MOVs 210 and reducing the number of the MOVs 210 coupled in parallel with the protected IGBTs 10a, 10b (blocks 330, 340). This enables the voltage v to be clamped at a lower level than when the switch 220 is non-conducting. With the switch 220 in the conducting state, the control circuit 230 continues to sense the voltage v (block 350). If the sensed voltage v falls below a second threshold level, the switch 220 is returned to the non-conducting state (blocks 360, 310). The second threshold level may be near the nominal operating voltage level and also may be lower than the first threshold level to provide hysteresis and increase stability. In some embodiments, the switch 220 may be maintained in the conducting state for a predetermined amount of time before returning to the non-conducting state, irrespective of the voltage v.

In some embodiments, the control circuit 230 may be activated and inactivated responsive to the voltage v applied to the protected IGBTs 10a, 10b. In particular, the control circuit 230 may receive power from the source 10 connected to the protected IGBTs 10a, 10b, and may be configured to be activated when the voltage v has a sufficient level (e.g., when the IGBTs 10a, 10b are off) to power the control circuit 230 and deactivated when the level of the voltage v is insufficient to maintain power to the control circuit 230 (e.g., when the IGBTs 10a, 10b are on). The switch 220 may be a normally open (off) device so that, when the control circuit 230 is deactivated, the switch 220 does not bypass any of the MOVs 210 of the string.

Figure 4:
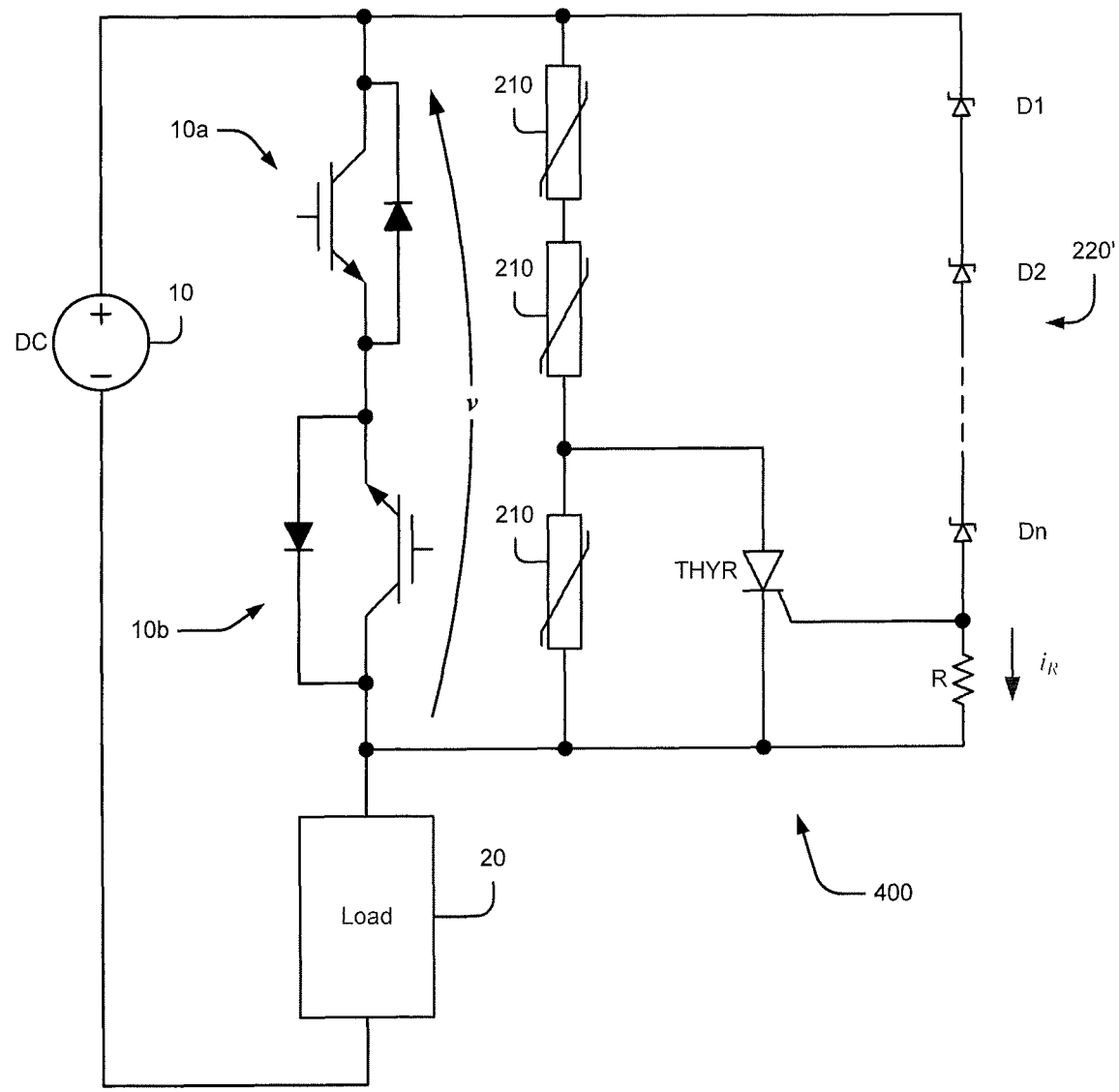
FIG. 4 is a schematic diagram illustrating a semiconductor device protection system according to further embodiments.

FIG. 4 illustrates an example control circuit implementation. In an overvoltage protection circuit 400, a control circuit 220' includes a thyristor THYR that is configured to bypass a subset of a string of series-connected MOVs 210. The control circuit 220' further includes a string of zener diodes D1, D2, ..., Dn coupled in series with a resistor R, with the string comprising the zener diodes D1, D2, ..., Dn and the resistor R being coupled in parallel with IGBTs 10a, 10b that control current provided to a load 20 from a power source 10. A control terminal of the thyristor THYR is coupled to a node where the resistor R is coupled to the zener diodes D1, D2, ..., Dn.

When a voltage v applied to the IGBTs 10a, 10b exceeds a level sufficient to cause a reverse current $i_R$ to flow through the zener diodes D1, D2, ..., Dn and the resistor R at a level sufficient to turn on the thyristor THYR, at least one of the series-connected MOVs 210 is bypassed to lower the clamping threshold voltage for the IGBTs 10a, 10b. The threshold voltage for turning on the thyristor THYR may be determined by the reverse breakdown (zener) voltages of the zener diodes D1, D2, ..., Dn and the number of zener diodes in the string of zener diodes D1, D2, ..., Dn. When the IGBTs 10a, 10b are turned on, the voltage v drops substantially below the aggregate zener voltages of the zener diodes D1, D2, ..., Dn, thus effectively deactivating the circuit and preventing turn on of the thyristor THYR.

It will be appreciated that the control circuit implementation illustrated in FIG. 4 is provided for purposes of illustration, and that other control circuit arrangements may be used in further embodiments of the inventive subject matter. For example, a thyristor or other type of switch may be controlled using circuitry other than the control circuitry shown in FIG. 4. For example, in some embodiments, a control circuit may employ a comparator circuit that compares the voltage v (or a derivative thereof) to a reference voltage and responsively provides a control signal to a control terminal of a thyristor or other switch. Such a comparator circuit may be configured to provide hysteresis in responding to the voltage applied to the protected device, and may be activated and deactivated responsive to the applied voltage.

In the drawings and specification, there have been disclosed exemplary embodiments of the inventive subject matter. Although specific terms are employed, they are used in a generic and descriptive sense only and not for purposes of limitation, the scope of the inventive subject matter being defined by the following claims.

That which is claimed:

1. An apparatus comprising:
   at least two series-connected MOVs configured to clamp a voltage applied to at least one semiconductor device;
   a switch configured to selectively bypass a subset of the least two series-connected MOVs; and
   a control circuit configured to cause the switch to shunt current through a first number of the at least two series-connected MOVs in a first state and to shunt current through a second number of the at least two series-connected MOVs in a second state,
   wherein the first state provides a clamping voltage greater than a maximum instantaneous voltage rating of the at least one semiconductor device and wherein the second state provides a clamping voltage less than or equal to the maximum instantaneous voltage rating of the at least one semiconductor device.

2. The apparatus of claim 1, wherein the first number of the at least two series-connected MOVs has a maximum continuous operating voltage rating greater than or equal to a maximum continuous operating voltage rating of the at least one semiconductor device and wherein the second number of the at least two series-connected MOVs has a maximum continuous operating voltage rating less than the maximum continuous operating voltage rating of the at least one semiconductor device.

3. The apparatus of claim 2, wherein the control circuit is configured to be activated responsive to the voltage applied to the at least one semiconductor device.

4. The apparatus of claim 1, wherein the at least two series-connected MOVs comprises a string of series-connected MOVs coupled between first and second terminals of the at least one semiconductor device and wherein the switch is coupled between a node of the string and one of the first and second terminals.

5. The apparatus of claim 1, further comprising the at least one semiconductor device.

6. An apparatus comprising:
 a string of series-connected voltage clamp devices configured to be coupled to at least one semiconductor switch;
 a bypass circuit configured to selectively bypass a subset of the string of series-connected voltage clamp devices to control a level at which a voltage across the at least one semiconductor switch is clamped; and
 a control circuit configured to cause the bypass circuit to shunt current through a first number of the series-connected voltage clamp devices in a first state and to shunt current through a second number of the series-connected voltage clamp devices in a second state responsive to the voltage across the at least one semiconductor switch,
 wherein the first state provides a clamping voltage greater than a maximum instantaneous voltage rating of the at least one semiconductor switch and wherein the second state provides a clamping voltage less than or equal to the maximum instantaneous voltage rating of the at least one semiconductor switch.

7. The apparatus of claim 6, wherein the string of series-connected voltage clamp devices is connected in parallel with the at least one semiconductor switch.

8. The apparatus of claim 6, wherein the first number of the series-connected voltage clamp devices has a maximum continuous operating voltage rating greater than or equal to a maximum continuous operating voltage rating of the at least one semiconductor switch and wherein the second number of the series-connected voltage clamp devices has a maximum continuous operating voltage rating less than the maximum continuous operating voltage rating of the at least one semiconductor switch.

9. The apparatus of claim 6, wherein the control circuit comprises:
 a string comprising at least one zener diode and at least one resistor coupled in series and having first and second terminals coupled to first and second terminals of the string of series-connected voltage clamp devices; and
 a semiconductor switch coupled in parallel with the subset of the string of series-connected voltage clamp devices and having a control terminal coupled to a terminal of the at least one resistor.

10. The apparatus of claim 6, wherein the string of series-connected voltage clamp devices comprises a string of series-connected metal oxide varistors (MOVs).

11. The apparatus of claim 6, further comprising the at least one semiconductor switch.

* * * * *